(12) United States Patent
Stackhouse

(10) Patent No.: US 6,185,148 B1
(45) Date of Patent: Feb. 6, 2001

(54) GENERAL PURPOSE DECODE IMPLEMENTATION FOR MULTIPORTED MEMORY ARRAY CIRCUITS

(75) Inventor: Blaine Stackhouse, Ft Collins, CO (US)

(73) Assignee: Hewlett-Packard Company, Palo Alto, CA (US)

( * ) Notice: Under 35 U.S.C. 154(b), the term of this patent shall be extended for 0 days.

(21) Appl. No.: 09/510,275

(22) Filed: Feb. 21, 2000

(51) Int. Cl.[7] .................................................. G11C 8/00
(52) U.S. Cl. .................. 365/230.08; 365/230.06
(58) Field of Search ..................... 365/230.08, 230.06, 365/230.03, 194, 196

(56) References Cited

U.S. PATENT DOCUMENTS

| | | | | |
|---|---|---|---|---|
| 5,394,373 | * | 2/1995 | Kawamoto | 365/230.06 |
| 5,615,164 | * | 3/1997 | Kirihata et al. | 365/230.06 |
| 5,745,432 | * | 4/1998 | McClure | 365/230.06 |
| 6,111,795 | * | 8/2000 | Takita et al. | 365/194 |

* cited by examiner

Primary Examiner—Richard Elms
Assistant Examiner—Anh Phung

(57) ABSTRACT

Among other things, the present invention provides an improved decoder section with a noise resistant input. In one embodiment, the section includes a ratioed gate and a stack with at least one transistor. The ratioed gate has an input for receiving a first input signal, which may be noisy, from one or more input signals and an output that generates a true value, when the gate is activated, if the first input signal is true. The stack with at least one transistor is operably connected to the ratioed gate. It has at least one input for receiving the remaining one or more input signals apart from the first input signal. When these remaining input signals are true, the stack activates the ratioed gate. Otherwise, if any of the remaining signals are false, it inactivates the gate. Accordingly, the ratioed gate generates a true output when all of the one or more inputs are true.

19 Claims, 6 Drawing Sheets

GENERAL PURPOSE DECODE IMPLEMENTATION FOR MULTIPORTED MEMORY ARRAY CIRCUITS

TECHNICAL FIELD

The present invention relates generally to integrated circuits and in particular to a decoder for enabling a portion of a memory array.

BACKGROUND

Various decoder schemes may be used to enable portions of memory in a memory array. A word line decoder generates a word line signal to activate (or enable) a quantity (e.g., a word) of memory within a memory bank. A bank may have numerous words and thus require numerous (e.g., 16) decoders. Each decoder produces a word line signal to enable the word for the implementation of either a store (write) or load (read) operation for a selected word of the memory bank. In doing so, it receives various store enable and load enable signals and generates the word line signal when either a store or load operation is to be performed.

FIGS. 1A and 1B show a traditional word line decoder circuit 50. Decoder circuit 50 receives fully dynamic, full-phase store and load enable signals (STEN0, STEN1, STEN2, LDEN0, and LDEN1) from store and load sources SS0, SS1, SS2, LS0, and LS1, respectively. These signals are triggered from the rising edge of a clock (CLK) signal. Decoder circuit 50 generates a word line enable signal (WL) if either all of the store enable or all of the load enable signals are true (e.g., high) at the same time when the clock is in its first phase (high).

One or more gates are depicted in the store and load source blocks to indicate their delay (in terms of gate delay) from the clock=s rising edge. Several gate delays can occur within a single phase of the clock single. That is, signals may occur at different points within the active (e.g., high) phase of the clock, but they all occur within that phase. In FIG. 1, the store enable signals, STEN0, STEN1, and STEN2, are delayed by one, two, and three gate delays from the clock's rising edge. In contrast, the load enable signals, LDEN0 and LDEN1, are both only delayed by one gate delay from the rising edge.

Circuit 50 includes a store decode section 60, a load decode section 70, and an output section 80. Store decode section 60 includes transistors Q1 through Q8; the load section includes transistors Q9 through Q15; and the output section includes transistors Q16 through Q22. Transistors Q1, Q6, Q7, Q9, Q13, Q14, Q16, Q20, and Q21 are PFET type transistors, and the remaining transistors are NFET type transistors.

Store section 60 is configured as a precharged AND gate with inputs at STEN0–STEN2, and an output at ST. Q1 through Q5 are connected in a stacked NAND precharge circuit configuration. Q1 is a precharge transistor, Q5 is an evaluate transistor, and Q2 through Q4 are the NAND input transistors making up the stack for receiving the STEN0, STEN1, and STEN2 signals, respectively. The clock (CLK) signal is connected to the gates of precharge transistor Q1 and evaluate transistors Q5. The drain of precharge transistor Q1 defines the precharged node, which is labeled NST, and is connected to the drain of Q2. Transistors Q7 and Q8 are configured as a conventional static inverter that has its input connected to the NST node and its output, which is labeled ST, defining the output node for the store section 60. Transistor Q6 serves as half-latch for holding up the NST node when the ST node goes Low.

The load section 70 is also configured as a precharge AND gate with inputs at LDEN0 and LDEN1, and an output at LD. Q9–Q12 form a precharged NAND stack having a precharged node at NLD. Q9 and Q12 are the precharge and evaluate transistors, respectively, with the clock signal connected to their gates. Q11 and Q12 serve as the NAND stack input transistors receiving the input LDEN0 and LDEN1 load enable signals, respectively. Q14 and Q15 form a static inverter having its input connected to the NLD node and an output providing the LD output node. With its drain connected to the NLD node and its gate connected to the LD node, Q13 serves as half-latch for holding up the NLD node when the LD node is low.

Output section 80 performs an OR function with its inputs being the ST and LD signals and its output being the word line (WL) signal. Q16–Q19 are connected in a precharge OR circuit configuration. Q16 and Q19 are precharge and evaluate transistors, respectively, with their gates connected to the clock signal. Q17 and Q18 are in a conventional NOR configuration with their commonly connected drains connected to the drain of precharge transistor Q16 and their commonly connected sources connected to the drain of evaluate transistor Q19. The gate of Q17 is connected to the LD node, and the gate of Q18 is connected to the ST node. Their commonly connected drains define the precharged node labeled NWL. Transistors Q21 and Q22 are connected in a conventional static inverter arrangement with the input connected to the NWL node and the output providing the WL node, which is the output of the decoder circuit 50. Q20 functions as half-latch with its drain connected to the NWL node for holding it up when the WL node is low.

With regard to the operation of the store section 60, during a precharge state, (when the clock is low), Q1 is turned on and Q5 is off. This causes node NST to precharge to a high value without regard to the values of STEN0–STEN2. Thus, during the precharge state, the Q7/Q8 inverter output at ST is low. When the clock transitions to a high (during an evaluate state), Q1 turns off and Q5 turns on. If all of the STEN0, STEN1, and STEN2 signals are true (or high) at the same time, node NST is discharged low, which causes ST to go high. Conversely, if any of these store enable signals are false (or low), the NST node remains charged high, and the ST output remains low. Accordingly, when STEN0, STEN1, and STEN2 are all high at the same time in an evaluate state, NST goes low and ST goes high indicating that a store operation is to occur.

The load section 70 functions in the same way. If LDEN0 and LDEN1 are high at the same time during an evaluate state (when CLK is high), the NLD node discharges and goes low. This causes the LD node to go high indicating that a load operation is to occur. Conversely, if any of LDEN0 or LDEN1 are not true, the NLD node remains charged high, and the LD node remains at a low value.

With regard to the output section 80, precharge transistor Q16 and evaluate transistor Q19 operate to precharge the NWL node during the precharge (clock low) state. During the evaluate state, if either ST or LD are high, node NWL is discharged low, which causes WL to go high. This corresponds to a word line activation. If neither ST or LD are high during the evaluation state, the WL node remains low, and the word line is not fired.

Unfortunately, there are several problems associated with this decoder solution. To begin with, circuit 50 uses fully clock dynamic gates for each of the decoder sections. That is, each of the sections has precharge and evaluate transistors that are continuously drawing clock power in their respective states. This clock loading problem is exaggerated in typical applications that require numerous word line decoders (e.g., 16, 32) for each memory bank. In addition, with a three input NAND stack in the store decoder section, the Q2–Q4 NFETs must be excessively large in order to operate sufficiently fast for most present-day applications. Moreover, the dynamic NAND inputs (at Q2–Q4 and Q10–Q11) can be especially sensitive to noisy inputs. This can be problematic—especially when some (or all) of the store enable and/or load enable signals are received from distant sources within a system such as a microprocessor. For example, with the decoder of FIG. 1, the STEN0 and LDEN0 signals are received from first-stage decoder sources that are 1200 microns away from the decoder circuit 50.

Accordingly, what is needed is an improved decoder scheme that will solve any or all of these problems.

SUMMARY OF THE INVENTION

Among other things, the present invention provides an improved decoder section with a noise resistant input. In one embodiment, the section includes a ratioed gate and a stack with at least one transistor. The ratioed gate has an input for receiving a first input signal, which may be noisy, from one or more input signals and an output that generates a true value, when the gate is activated, if the first input signal is true. The stack with at least one transistor is operably connected to the ratioed gate. It has at least one input for receiving the remaining one or more input signals apart from the first input signal. When these remaining input signals are true, the stack activates the ratioed gate. Otherwise, if any of the remaining signals are false, it inactivates the gate. Accordingly, the ratioed gate generates a true output when all of the one or more inputs are true.

In addition, the present invention provides a decoder circuit with an improved output section. In one embodiment, the improved output section includes a first input for receiving a first signal, a second input for receiving a second signal, and an output for providing a dynamic output signal that is true during an evaluate state if either the first or second signal is true during the evaluate state. The output section also includes a precharged node and a first transistor that is operably connected to the first input and between the precharged node and ground to discharge the precharged node if the first signal is true during the evaluate state. The first transistor is adapted to receive the first signal in order to turn off when the first signal is false and turn on when the first signal is true. This occurs because the first signal is pulsed so that it will only be true in the evaluate stat, which ensures that the first transistor is off during the precharged state.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 1A:
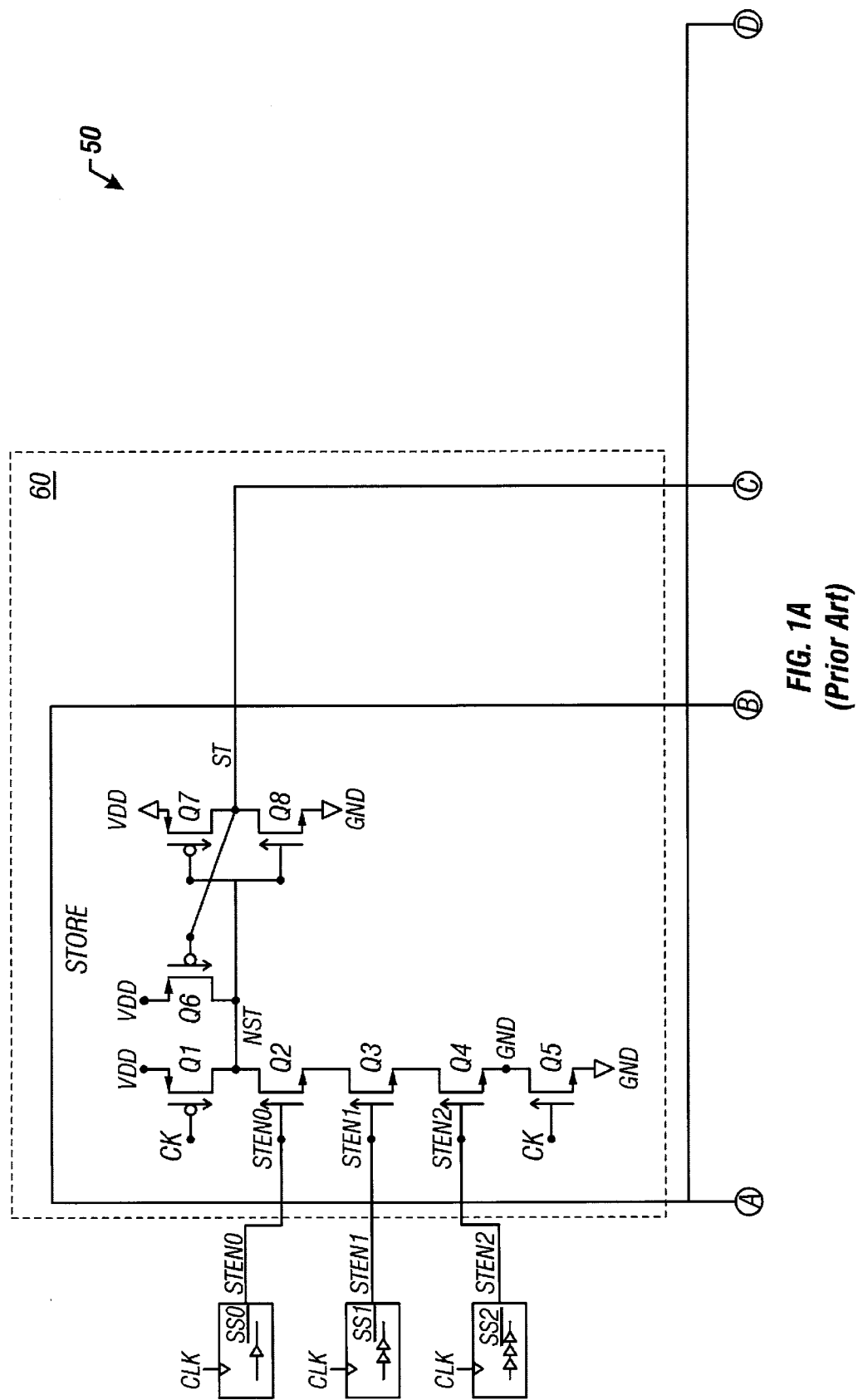
FIGS. 1A and 1B show a schematic diagram of a prior art word line decoder circuit.
Figure 1B:
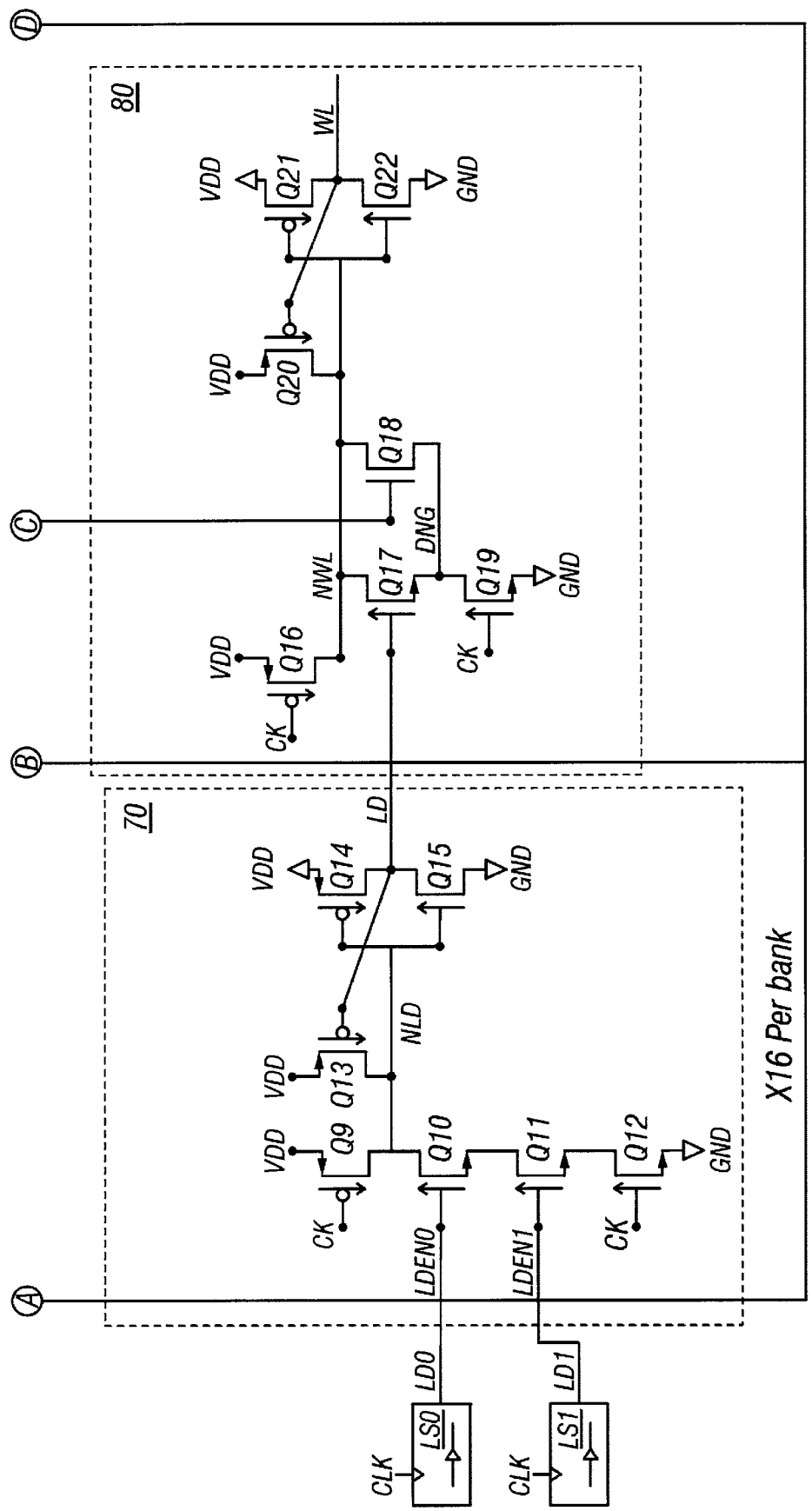
Figure 2A:
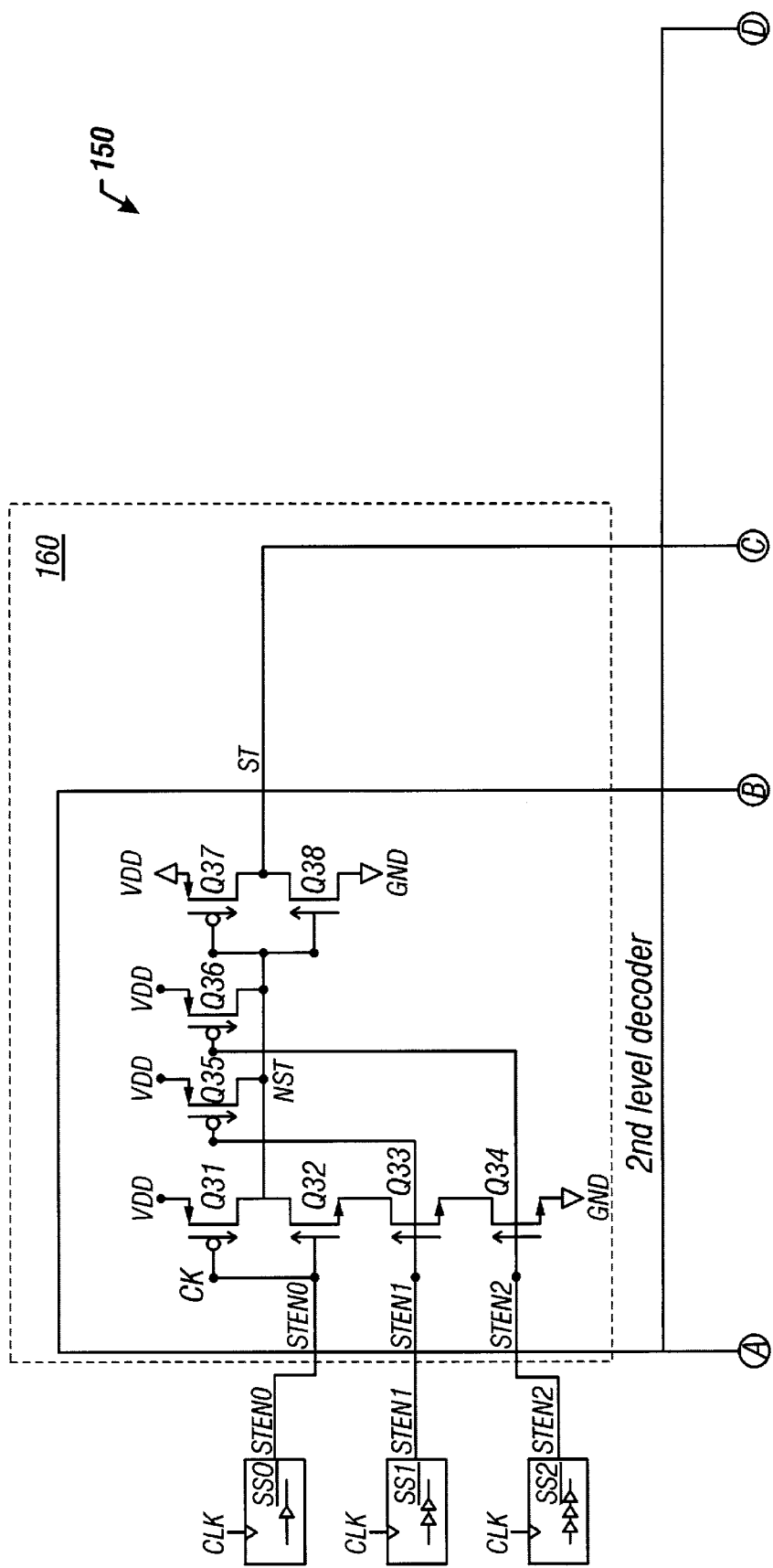
FIGS. 2A and 2B show a schematic diagram of one embodiment of a word line decoder circuit of the present invention.
Figure 2B:
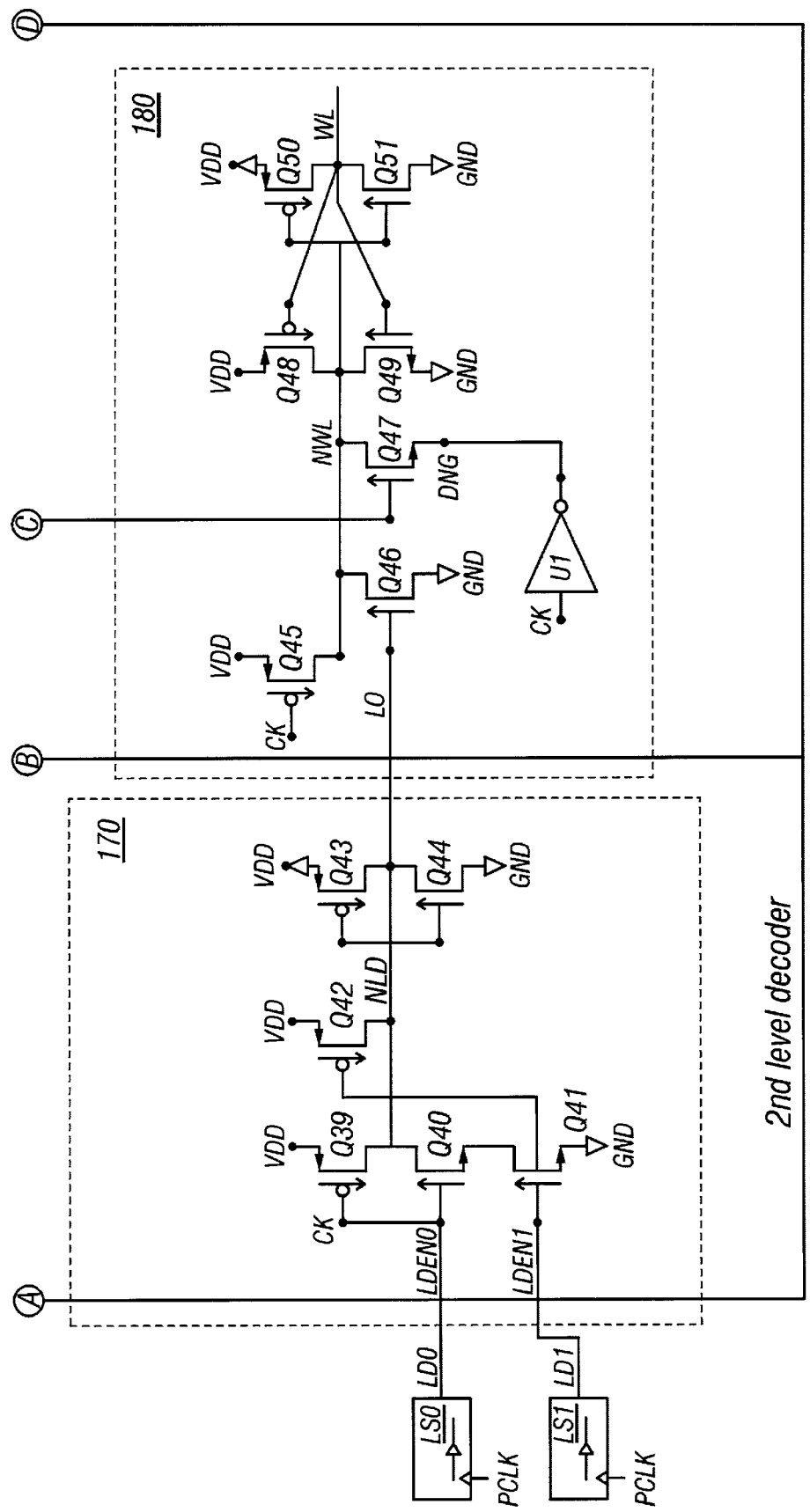

FIGS. 2A and 2B show one embodiment of a decoder circuit 150 of the present invention. Decoder 150 receives store enable signals STEN0, STEN1, and STEN2 and load enable signals LDEN0 and LDEN1 from sources SS0, SS1, SS2, LS0, and LS1, respectively. Based on these signals, it generates a word line signal WL for activating a word of memory within a memory bank. Note that in the depicted application, the store enable signals are out of phase with one another. As a result, they are clocked with full phase clocks and maintained as full phase signals. In contrast, the load enable signals are substantially in-phase with each other (albeit they may be delayed from the clock's rising edge). This allows them to be transmitted with a pulse clock that is generated from the clock signal. This causes them to be converted into pulses rather than full phase signals. In the depicted embodiment, the pulses occur for about 25% of a phase of the clock. The relevance of this will be addressed below. It is also worth reminding at this time that in the depicted embodiment, the STEN0 and LDEN0 signals are received from relatively distant sources, which makes them fairly noisy.

Circuit 150 generally includes store section 160, load section 170 and output section 180. The store section includes transistors Q30 through Q38; the load section includes transistors Q39 through Q44; and the output section includes transistors Q45 through Q51 and inverter U1. Q31, Q35–Q37, Q39, Q42, Q43, Q45, Q48, and Q50 are PFET type transistors, and the remaining transistors are NFET type transistors. U1 is a conventional inverter; it may be implemented, for example. with a stacked PFET/NFET static inverter configuration, which is actually used throughout circuit 150.

The store section 160 performs an AND function with respect to inputs STEN0, STEN1, and STEN2 and provides the logical output at the node marked ST. Q31–Q36 are configured as a 3 input static NAND gate. The gates of Q31 and Q32 are tied together as the input for STEN0, and their drains are tied together at the output marked NST. The source of Q31 is connected to $V_{DD}$. The source of Q32 is connected to the drain of Q33. Providing the other NAND gate inputs (for STEN1 and STEN2), Q33 and Q34 are stacked together with the source of Q33 connected to the drain of Q34, and the source of Q34 being connected to ground. The STEN0 signal is connected to the gates of Q31/Q32; the STEN1 signal is connected to the gate of Q33; and the STEN2 signal is connected to the gate of Q34. The gate of Q35 is connected to the gate of Q33, and its drain is connected to the NST node. Similarly, the gate of Q36 is connected to the gate of Q34, and the drain of Q36 is also connected to the NST node. Q37 and Q38 are configured as a conventional static inverter with their gates tied together as an input for the NST node and their drains tied together for providing the ST output.

Q31 through Q36 function as a static ratioed NAND gate. Q35 and Q36 serve as pull-up transistors for pulling up the NST node when either STEN1 or STEN2 is low. Thus, when STEN0, STEN1, and STEN2 are all high, the output at NST is low. If any of STEN0 through STEN2 are low, NST will be high. Inverter Q37/Q38 causes node ST to go high when NST goes low, which (as will be addressed below) causes the word line (WL) to fire for a store operation. Conversely, ST remains low if NST remains high, which is its nominal value for this dynamic, monotonic circuit.

(It is worth noting at this time that in contrast to the prior art, the STEN0 signal now feeds into a static, ratioed input, i.e., at the gates of Q31/Q32. In general, a ratioed input is one that requires a transistor to turn off, as well as for one to turn on, in order for an output to change in response to a sufficient change at the input. The ratioed input of Q31/Q32 is much less sensitive to noise, which is important with the depicted embodiment where STEN0 is received from a distant, noisy source.)

The load section 170 also performs an AND function. It logically ANDs input signals LDEN0 and LDEN1 and provides the logical result at the output marked LD. Load section 170 is similarly configured with the store section 160. Q39–Q42 are configured as a 2 input static NAND gate. The gates of Q39 and Q42 are tied together and provide one of the NAND gate inputs for receiving the LDEN0 signal. The drains of Q39 and Q40 are tied together forming the NAND output node, which is labeled NLD. The source of Q39 is connected to $V_{DD}$ and the source of Q40 is connected to the drain of Q41. The gate of Q41 serves as the other NAND gate input and is connected to the LDEN1 signal. Its source is connected to ground. Q42 functions as a pull-up transistor for NLD. Its gate is connected to the gate of Q41; its drain is connected to the NLD node; and its source is connected to $V_{DD}$. Q43 and Q44 are connected as a conventional static inverter with their gates connected together at the NLD node and their drains connected together and defining the LD output node.

As with the STEN0 input, the LDEN0 input at the gates of Q39/Q40 is ratioed, which makes it less sensitive to noise. This is important because the LDEN0 signal is also relatively noisy. When LDEN0 and LDEN1 are both high, the output at NLD goes low, which makes the LD output go high. Conversely, if either input signal is low, the NLD output remains high, which causes the LD output to remain low.

Output section 180 performs an OR function on the ST and LD signals and provides as its output the WL signal. The source of precharge transistor Q45 is connected to $V_{DD}$, its gate is connected to the clock (CLK), and its source is connected to the precharged node, which is marked NWL. Transistors Q46 and Q47 are each configured with their drains connected to the NWL node. The gate of Q46 is connected to the LD signal, and the gate of Q47 is connected to the ST signal. The source of Q46 is connected to ground. In contrast, the source of Q47 is connected to a virtual ground node marked DNG, which is provided by the output of inverter U1. The input of U1 is connected to the clock. Q48 and Q49 are connected as a conventional, static inverter. Likewise, Q50 and Q51 are connected as a conventional inverter. The input of the Q48/Q49 inverter is connected to the NWL node, and its output provides the WL node. The Q50/Q51 inverter, which serves as a latch for the NWL node, is inversely connected across the Q48/Q49 inverter with its input being connected to the WL node and its output being connected to the NWL node.

With regard to the operation of the output section 180, during a precharge (phase 2 or low) phase of the clock, precharge transistor Q45 charges the NWL node to a high value with Q46 and Q47 being off at this time. Q46 will be off because the pulsing of the load enable signals ensures that the LD signal is low during the precharge state (clock phase 1). Alternatively, Q47 will be off as a result of inverter U1. With the clock being low in this precharge state, inverter U1 generates a high at the DNG node (or source of Q47), which ensures that Q47 will not discharge the NWL node. When the clock transitions to its first phase (high), the virtual ground node at DNG becomes low providing a virtual ground to the source of Q47. This allows the NWL precharged node to discharge low if either ST or LD fires high during this time. If the NWL node discharges low, the Q48/Q49 inverter provides a high at the WL output for activating the word line. The Q50/Q51 inverter serves to latch the WL output high for the entire evaluate state responsive to the NWL node going low. This will come into play when the output section 180 is fired from the LD pulse. If the NWL node is not discharged during the evaluate state, the WL output remains low.

Figure 3A:
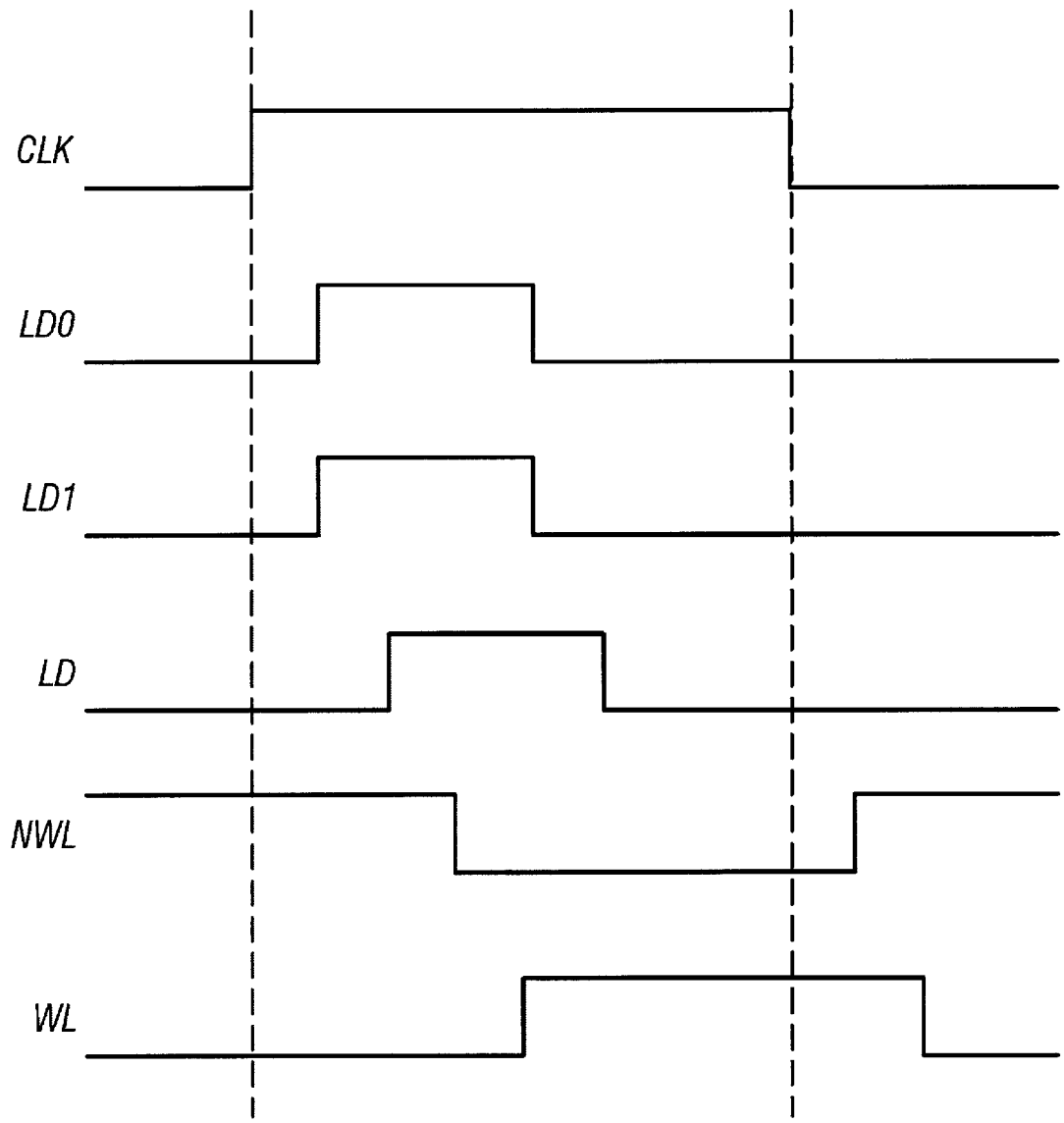
FIG. 3A shows a timing diagram for a store operation with the circuit of FIG. 2.

FIG. 3A is a timing diagram illustrating the firing of the WL signal in circuit 150 for a load operation. As mentioned above, the LDEN0 and LDEN1 signals, prior to reaching the depicted load sources, LS0 and LS1, are sufficiently in phase with one another that they can be pulsed (i.e., converted into pulses) at the load sources and yet overlap one another to generate an active LD signal. Thus, the LDEN0 and LDEN1 signals are pulsed within the load sources from a rising edge of the clock. In one embodiment, these pulses are approximately one-fourth of a clock phase. The load enable pulses cause the load section 170 to generate an LD pulse, which causes Q46 to turn on and discharge the NWL precharged node. For this embodiment, it can be assumed that the load enable and store enable signals will not be active at the same time. Thus, the ST node is low during this time. When the NWL node discharges, the output at WL is flipped high and remains so until the clock transitions to its low phase, which causes the NWL precharge node to go high again. The Q50/Q51 inverter, which is configured as a latch, is used to latch the WL output high after the LD pulse goes low, which causes Q46 to turn off.

Figure 3B:
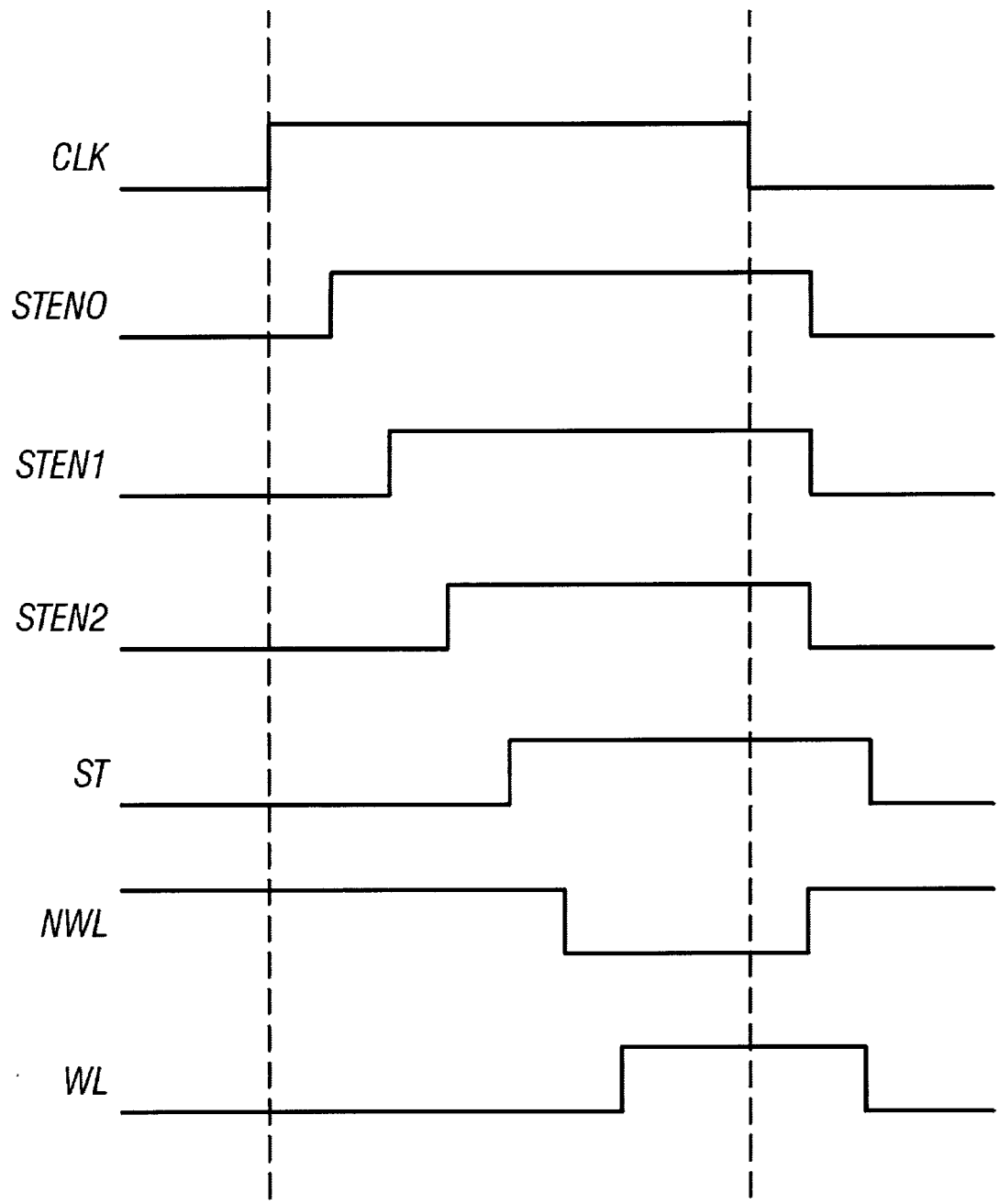
FIG. 3B shows a timing diagram for a load operation with the circuit of FIG. 2.

FIG. 3B is a timing diagram showing the various timing signals in circuit 150 when a store operation is performed. Again, during the clock's second phase (precharge state), precharged node NWL is charged to a high value. However, because STEN0, STEN1, and STEN2 are delayed from each other, they are not pulsed like the load enable signals. Rather, they are transmitted in full phase to ensure that if they are all active for a clock cycle, they will overlap with one another for at least some portion within the first clock phase to activate the store section 160. When each of the store enable signals has gone high, the ST node fires high, which causes input gate transistor Q47 to turn on and discharge the NWL precharged node, which causes WL to fire high.

With the delayed store enable signals not being pulsed, which results in the ST signal lasting through the falling clock edge, the virtual ground at DNG is used so that Q47 turns off when the clock goes low. If an actual ground were used (as is the case with the load side of output section 180), the ST signal would cause Q47 to remain on and allow the WL signal to be high in the precharge (second clock phase state), which would not be tolerable. However, with U1, when clock goes low, the virtual ground node DNG goes high and inhibits Q47 from being on. In fact, with ST still high when the clock transitions low, the high DNG node actually turns on Q47 in the reverse direction, which assists in pre-charging the NWL node.

The various advantages of the present invention, as embodied in decoder 150, will be discussed. In this embodiment, sixteen decoders are used for each bank. However, only one decoder fires at any time. Thus, in one embodiment of the invention, only one of the virtual ground inverters is used to supply a virtual ground for the sixteen different decoders, which reduces consumed transistor space.

In addition, with regard to the output section, the dynamic evaluation NFETs for the load side have been completely removed. This is made possible with the use of the pulsed load enable signals, which alleviates the need for an evaluation transistor since the input gate transistor (Q46) is assured of being off in a precharge state. This also reduces the required size of the circuit components.

Moreover, the precharge and evaluation transistors have been removed from the store and load sections. That is, these sections no longer have to use precharged circuits. The removal of these components significantly reduces the loading on the clock, which was a problem in the prior art designs. However, circuit 150 still has the same performance as a dynamic circuit from a time and evaluation point of view and still produces a dynamic output.

Finally, in the prior art circuit, simple ratio-less gates were used as inputs for the noisy store and load enable signals. In contrast, decoder 150 uses static, ratioed inputs, which are much less sensitive to noise.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A decoder section having a noise-resistant input, the decoder section comprising:
   a ratioed gate having an input for receiving a first input signal from one or more input signals and an output that generates a true value when the first input signal is true if the gate is activated; and
   a stack of at least one transistor operably connected to the ratioed gate and having at least one input for receiving the remaining one or more input signals apart from the first input signal, wherein the stack activates the gate when the remaining input signals are true and inactivates the gate if any of the remaining signals is false, whereby the gate generates a true output when all of the one or more input signals are true.

2. The decoder section of claim 1 wherein the stack is connected in series with the ratioed gate to inactivate it when any of the remaining one or more inputs are false.

3. The decoder section of claim 2 further comprising a pull transistor having an input connected to a first remaining signal from the remaining one or more input signals, wherein the pull transistor is connected at the output of the ratioed gate to pull the value to a false state if the first remaining signal is false.

4. The decoder section of claim 1 wherein the ratioed gate is a ratioed inverter that includes a PFET type transistor connected to an NFET type transistor with their gates and drains tied together, whereby the gates provide the input and the drains provide the output for the ratioed inverter.

5. The decoder section of claim 4 wherein the at least one transistor in the stack is an NFET type transistor with its gate connected to one of the remaining one or more input signals and its drain and source being connected between the ratioed inverter and ground.

6. A decoder circuit with a precharge and an evaluate state, the decoder including an output section comprising:
   a first input for receiving a first signal, a second input for receiving a second signal, and an output for providing a dynamic output signal that is true during the evaluate state if one of the first and second signals is true during the evaluate state;
   a precharged node; and
   a first transistor operably connected to the first input and between the precharged node and ground to discharge the precharged node if the first signal is true during the evaluate state, wherein the first transistor is adapted to receive the first signal in order to turn off when the first signal is false and turn on when the first signal is true, the first signal being pulsed to only be true in the evaluate state, whereby the first transistor is off during the precharged state.

7. The decoder of claim 6 wherein the output section further comprises a second transistor operably connected between the precharged node and a virtual ground node for discharging the precharged node when the second signal is true during the evaluate state, wherein the second signal may be true in both the precharge and evaluate states, the virtual ground being active during the evaluate state and inactive during the precharged state.

8. The decoder of claim 7 wherein the output section further comprises an inverter with its output connected to the virtual ground node and its input connected to the clock, whereby the virtual ground is active when the clock is in the evaluate state and inactive when the clock is in the precharge state.

9. The decoder of claim 6 wherein the output section further comprises a latch operably connected to the precharged node for holding the precharged node discharged after the first signal true pulse goes false within the evaluate state.

10. The decoder of claim 6 further comprising a first section operably connected to the output section for providing it the first signal, the first section having one or more inputs for receiving one or more first section signals and generating a true value at the first signal when the one or more first section signals are true during the evaluate state.

11. The decoder of claim 10 wherein the first section includes a ratioed gate having an input for receiving one of the one or more first section signals and an output for providing a gate output signal that is true in response to the one or more first section signals being true, wherein the first signal corresponds to the gate output signal.

12. The decoder of claim 11 further comprising a second section operably connected to the output section for providing it the second signal, the second section having one or more inputs for receiving one or more second section signals and generating a true value at the second signal when the one or more second section signals are true during the evaluate state.

13. The decoder of claim 12 wherein the first section is a load section, and the second section is a store section, whereby the decoder is a word line decoder.

14. The decoder of claim 8 wherein the inverter provides a virtual ground for a plurality of decoders, wherein only one of the plurality of decoders will generate a true at its output during an evaluate state.

15. A word line decoder having a precharge state and an evaluate state, comprising:

a store section having inputs for receiving one or more store enable signals and an output for providing a store output signal, wherein the store output signal is true when the one or more store enable signals are true, the store section having a ratioed gate with an input for receiving a first of the one or more store enable signals and an output that is true when the one or more store enable signals are true, wherein the store output corresponds to the store section ratioed gate output;

a load section having inputs for receiving one or more load enable signals and an output for providing a load output signal, wherein the load output signal is true when the one or more load enable signals are true, the load section having a ratioed gate with an input for receiving a first of the one or more load enable signals and an output that is true when the one or more load enable signals are true, wherein the load output corresponds to the output of the load section ratioed gate; and an output section having a store input connected to the store output, a load input connected to the load output, and a word line output that provides a true value during the evaluate state if one of the store and load outputs are true.

16. The decoder of claim 15 wherein the output section includes:

(a) a precharged node; and (b) a first transistor operably connected to the load input and between the precharged node and ground to discharge the precharged node if the load signal is true during the evaluate state, wherein the first transistor receives the load signal and turns off when the load signal is false and turns on when the load signal is true, the load signal being pulsed to only be true in the evaluate state, whereby the load transistor is off during the precharge state.

17. The decoder of claim 16 wherein the output section further comprises a second transistor operably connected to the store input and between the precharged node and a virtual ground node for discharging the precharged node when the store signal is true during the evaluate state, wherein the store signal may be true in both the precharge and evaluate states, the virtual ground being active during the evaluate state and inactive during the precharged state.

18. The decoder of claim 17 wherein the output section further comprises an inverter with its output connected to the virtual ground node and its input connected to a clock defining the precharge and evaluate states, whereby the virtual ground is active when the clock is in the evaluate state and inactive when the clock is in the precharge state.

19. The decoder of claim 16 wherein the output section further comprises a latch operably connected to the precharged node for holding the precharged node discharged after the load signal pulse goes from true to false within the evaluate state.

* * * * *